United States Patent [19]

Matsuzaki

[11] Patent Number: 4,635,346
[45] Date of Patent: Jan. 13, 1987

[54] METHOD FOR PRODUCING HYBRID INTEGRATED CIRCUIT

[75] Inventor: Kazuhiro Matsuzaki, Yokohama, Japan

[73] Assignee: Kabushiki Kaisha Toshiba, Kawasaki, Japan

[21] Appl. No.: 669,364

[22] Filed: Nov. 8, 1984

[30] Foreign Application Priority Data

Nov. 11, 1983 [JP] Japan .................. 58-210987
Nov. 11, 1983 [JP] Japan .................. 58-210988

[51] Int. Cl.⁴ .............................. C08L 23/26
[52] U.S. Cl. ................... 29/577 R; 29/589; 29/590; 29/840; 156/241; 156/326
[58] Field of Search ............ 29/840, 837, 577 R, 29/589, 590; 228/106, 111, 114, 123, 124; 156/241, 295, 325, 326, 327; 524/317, 505, 274

[56] References Cited

U.S. PATENT DOCUMENTS 3,644,252  2/1972  Shenfeld et al. ............ 260/27 R
3,955,997  5/1976  Sagane et al. ................ 106/131
4,157,319  6/1979  Feeney et al. ............... 260/27 BB
4,215,025  7/1980  Packer et al. ............... 260/29.2 R
4,251,597  2/1981  Emmons et al. ............. 428/500
4,329,779  5/1982  England ...................... 29/840
4,444,858  4/1984  Nishibu et al. .............. 430/49

Primary Examiner—Brian E. Hearn
Assistant Examiner—T. Quach
Attorney, Agent, or Firm—Finnegan, Henderson, Farabow, Garrett & Dunner

[57] ABSTRACT

A method for producing a hybrid integrated circuit includes steps of: applying an adhesive to an electronic part mounting conductor on an insulating substrate; adhering an electronic part to the applied adhesive and hardening the adhesive to temporarily fix the electronic part; fixing the temporarily fixed electronic part on the conductor with solder; and dissolving the hardened adhesive in a solvent and removing it. Upon being hardened, the adhesive can withstand the heat of molten solder and can be dissolved in a solvent and removed therewith.

5 Claims, 5 Drawing Figures

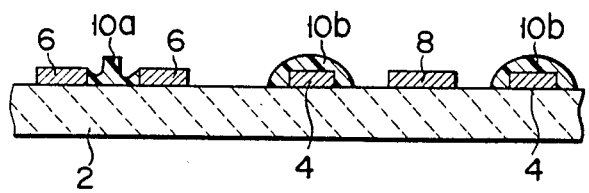
F I G. 1
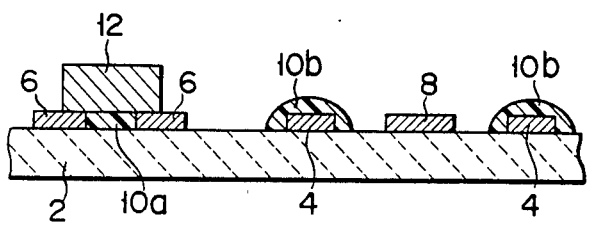
F I G. 2
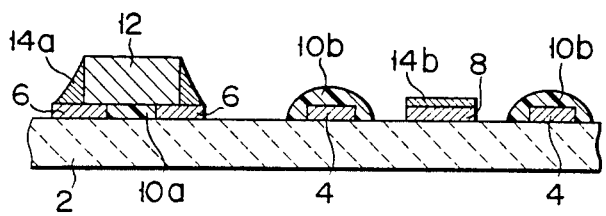
F I G. 3
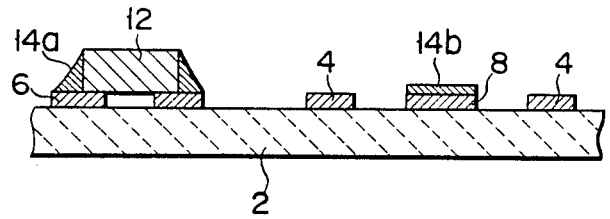
F I G. 4
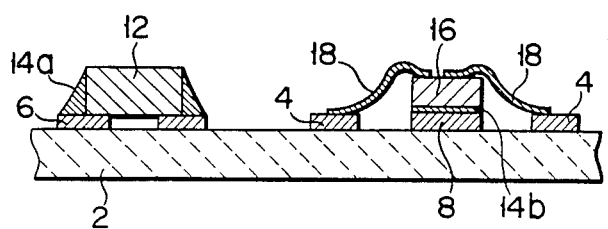
F I G. 5

METHOD FOR PRODUCING HYBRID INTEGRATED CIRCUIT

BACKGROUND OF THE INVENTION

The present invention relates to a method for producing a hybrid integrated circuit and, more particularly, to a method for producing a hybrid integrated circuit, including an improved step of mounting electronic parts on an insulating substrate.

A certain type of high-frequency electronic circuit such as a high-frequency amplifier cannot be realized in a monolithic integrated circuit by current semiconductor techniques and is therefore generally formed into a hybrid integrated circuit. Such a hybrid integrated circuit is assembled by mechanically mounting a plurality of discrete parts on a substrate. For this reason, hybrid integrated circuits are subject to large variations in characteristics and improvements in this respect have been desired. Furthermore, in a high-frequency integrated circuit, the mounting precision of electronic parts must be high.

Electronic parts such as capacitors or resistors are fixed with solder on a conductor formed on an insulating substrate. In this case, in order to improve the mounting precision of parts, the electronic parts are temporarily fixed on the substrate conductor with an adhesive containing mainly an epoxy resin or silicone resin and are thereafter fixed with solder. However, such an adhesive, once hardened, cannot be dissolved in a solvent. As a result, the hardened adhesive remains between the substrate and the electronic parts of the obtained hybrid integrated circuit. Therefore, the adhesive forces of the adhesive and solder act on a single electronic part in different magnitudes and at different points. Such forces generate stress at each adhered portion. This stress in turn results in a mechanical distortion and degrades the electrical characteristics of the circuit. In a worst case, the electronic part may be damaged in a temperature cycle test.

When a semiconductor chip which can be wire bonded must also be directly mounted on the insulating substrate in addition to electronic parts, a more complex problem is presented. When an electronic part is soldered on the conductor after the semiconductor chip is mounted on the conductor of the insulating substrate, the chip, if not well protected, is prone to contamination with solder flux or thermal influence, thereby degrading the characteristics of the integrated circuit. However, when the semiconductor chip is mounted on the conductor after the electronic part is soldered on the conductor of the insulating substrate, the chip mounting portion must be protected so as not to be contaminated with solder flux during soldering. Therefore, in either case, soldering cannot be easily performed by the dipping method unless a highly heat-resistant easy to remove protective film is used.

To resolve this problem, a method has been proposed which uses a cream solder wherein a solder powder is dispersed in a solvent together with a resin flux and which replaces the dipping soldering method. According to this method, the cream solder is applied at a predetermined position on the insulating substrate by screen printing or the like. After the electronic parts and the semiconductor chips are placed on the substrate, the structure is heated to harden the solder. However, in this method, since the cream solder reflows upon being heated, the positioning precision of the electronic parts and chip is degraded.

SUMMARY OF THE INVENTION

It is an object of the present invention to provide a method for producing a hybrid integrated circuit, which includes a mounting method of an electronic part which does not allow a hardened adhesive to remain on a substrate to adversely affect the characteristics of an electronic part.

It is still another object of the present invention to provide a method for producing a hybrid integrated circuit, which includes a mounting method of an electronic part which allows a high precision in mounting electronic parts on a substrate.

In order to achieve the above objects of the present invention, there is provided a method for producing a hybrid integrated circuit comprising the steps of:

applying an adhesive to an electronic part mounting portion of a conductor on an insulating substrate, the adhesive upon being hardened being capable of withstanding a temperature of molten solder and of being dissolved in a solvent to be removed therewith;

adhering an electronic part to the applied adhesive and hardening the adhesive to temporarily fix the electronic part in position;

fixing the temporarily fixed electronic part with solder on the conductor on the insulating substrate; and dissolving the hardened adhesive in a solvent and removing the dissolved adhesive.

According to an aspect of the present invention, the adhesive contains a polymer or a copolymer of substituted or non-substituted styrene dissolved in a solvent essentially consisting of substituted or non-substituted Carbitol acetates, and a silica powder dispersed in the solvent.

According to the present invention, the adhesive used for temporarily fixing the electronic part on the substrate does not remain on a finished product and the electronic part can be mounted at a precise position.

BRIEF DESCRIPTION OF THE DRAWINGS

FIGS. 1 to 5 are schematic sectional views showing in sequential order the steps of mounting electronic parts according to the present invention.

DETAILED DESCRIPTION OF THE PREFERRED EMBODIMENT

The method of the present invention is applied to mounting electronic parts such as capacitors or resistors on a general insulating substrate consisting of a ceramic such as alumina.

In an insulating substrate of alumina or the like, a conductor layer of plated nickel or the like is generally formed on a metallized layer of molybdenum, manganese or tungsten. The conductor layer is formed into a predetermined shape and comprises, for example, a portion for mounting an electronic part such as a capacitor and a portion for mounting a semiconductor chip such as a transistor.

An adhesive according to the present invention is applied on the electronic part mounting portion of the conductor on the insulating substrate by a conventional method such as screen printing. The adhesive contains a polymer or a copolymer of substituted or non-substituted styrene dissolved in a solvent essentially consisting of substituted or non-substituted Carbitol acetates, and a silica powder dispersed in the solvent.

The substituted or non-substituted Carbitol acetates may be acetates of Carbitol or monoalkyl-substituted Carbitols such as methylcarbitol, mono-n-butylcarbitol, or mono-iso-butylcarbitol. These acetate components serve as a solvent of resin components and impart a suitable hardening property to the adhesive. The solvent components can be used in an amount within a range in which the adhesive can be applied on the substrate by the conventional method such as a screen printing.

The substituted or non-substituted styrene may be styrene or alkyl-substituted styrene such as methylstyrene or ethylstyrene. The styrene copolymer may be a copolymer of styrene with a styrene derivative, a copolymer of styrene with acrylonitrile or butadiene, or the like. These resin components are main components which directly impart adhesiveness to the mixture.

The silica powder is used to provide a suitable thixotropy to the adhesive. When the silica powder is mixed in the adhesive, the adhesive can securely hold a pattern formed by screen printing and can maintain the pattern in a high-temperature solder bath. The silica to be used is not particularly limited but may be fumed silica, precipitated silica, molten silica, sintered silica or silica aerogel. The size of the silica particles is preferably small. Therefore, silica aerogel having a size of about 5 to 50 m$\mu$m is preferably used.

Since the adhesive is colorless and transparent or semitransparent, a colorant, preferably, an alcohol-type colorant is mixed in order to improve workability.

An electronic part is placed on the thus coated adhesive and then the adhesive is dried to harden at an air-heated temperature such as 130° to 170° C. for about 15 to 30 minutes. When the adhesive is hardened, the electronic part is temporarily fixed at its mounting portion of the conductor with high precision.

Thereafter, the substrate having the temporarily fixed electronic part thereon is dipped in a solder bath to fix the electronic part to the conductor with solder. The hardened adhesive will not be softened even after being immersed in the molten solder at about 230° to 250° C. for about 15 seconds. Thus, the electronic part is correctly held at the mounting position. The adhesive may be applied to portions of the conductor at which the solder should not be applied so as to serve as a solder resist in this soldering process.

After the electronic part is fixed with solder, the overall structure is dipped in a suitable solvent to dissolve and remove the adhesive. The solvent to be used in this case may be an aromatic hydrocarbon such as benzene, toluene, or xylene; a halogenated hydrocarbon such as trichloroethylene or tetrachloroethylene; methyl ethyl ketone; or cyclohexane.

Therefore, according to the method of the present invention, the hardened adhesive which temporarily fixed the electronic part is dissolved in a solvent and is removed after the solder fixing process. Therefore, the adhesive does not remain on the finished product and does not adversely affect the electronic part. Furthermore, when the electronic part is fixed with solder, it can be fixed in position with the hardened adhesive, and the mounting position of the electronic part will not deviate from the original position. According to the present invention, solder can be used in the dipping soldering method, so that the soldering process can be simplified.

A preferred embodiment of the present invention will now be described with reference to the accompanying drawings. This embodiment corresponds to a case wherein a semiconductor chip and an electronic part are mounted on an insulating substrate.

Referring to FIG. 1, an adhesive was applied to lead wire connecting conductors 4 and a recessed portion in an electronic part mounting conductor 6 on an alumina substrate 2 to form adhesive layers 10b and an adhesive layer 10a, respectively. Although a semiconductor chip mounting conductor 8 was also formed on the substrate, the adhesive was not applied to the conductor 8 since a solder layer will be formed on the conductor 8 in a later step. The adhesive used contained 3 parts by weight of high-flowability polystyrene (DENKA Co., Japan), 96.5 parts by weight of n-butyl Carbitol acetate and 0.5 parts by weight of silica aerogel.

Then, as shown in FIG. 2, an electronic part 12 such as a capacitor was adhered to the adhesive layer 10a coated on the conductor 6. The structure was dried in air at a temperature of 150° C. to harden the adhesive layers 10a and 10b. After the hardening process, the electronic part 12 was fixed on the conductor 6.

The substrate 2 having the temporarily fixed electronic part 12 was dipped in a solder bath at 240° C. for about 15 seconds so as to fix the electronic part 12 and the conductor 6 with solder 14a, as shown in FIG. 3. At the same time, solder 14b was also attached to the chip mounting conductor 8. However, the lead wire connecting conductors 4 coated with the hardened adhesive 10b were completely protected from the solder.

The overall structure was dipped in a trichloroethylene bath and washed therein to remove the hardened adhesive layers 10a and 10b, as shown in FIG. 4. Thus, the adhesive layer 10a which had temporarily fixed the electronic part 12 to the substrate 2 was completely removed, and the electronic port 12 was fixed to the conductor 6 of the substrate 2 with the solder 14a only. The adhesive layers 10b which had protected the lead wire connecting conductors 4 were removed, and the conductors 4 were exposed.

Finally, as shown in FIG. 5, a semiconductor chip 16 was mounted on the solder 14b on the chip mounting conductor 8. Subsequently, the chip 16 and the lead wire connecting conductors 4 were connected with bonding wires 18 to complete a hybrid integrated circuit.

What is claimed is:

1. A method for producing a hybrid integrated circuit, comprising the steps of:
    applying an adhesive to lead wire connecting conductors and to an electronic part mounting portion of a conductor on an insulating substrate, the adhesive containing a polymer or a copolymer of a substituted or non-substituted styrene dissolved in a solvent consisting essentially of substituted or non-substituted Carbitol acetate, and a silica powder dispersed in the solvent and upon being hardened being capable of withstanding a temperature of molten solder and of being dissolved in a solvent;
    adhering an electronic part on the applied adhesive and hardening the adhesive to temporarily fix the electronic part in position;
    fixing with solder the temporarily fixed electronic part on the conductor on the insulating substrate; and
    dissolving the hardened adhesive in a solvent and removing the dissolved adhesive.

2. A method according to claim 1, wherein the polymer or copolymer of the substituted or non-substituted styrene is at least a compound selected from the group consisting of a polymer of styrene, methylstyrene or ethylstyrene; a copolymer of styrene with a styrene derivative; and a copolymer of styrene with acrylonitrile or butadiene.

3. A method according to claim 1, wherein the substituted or non-substituted Carbitol acetate is at least one, member selected from the group consisting of acetates of Carbitol, methyl Carbitol, mono-n-butyl Carbitol, and mono-iso-butyl Carbitol.

4. A method according to claim 1, wherein the silica powder is one member selected from the group consisting of a fumed silica powder, a precipitated silica powder, a molten silica powder, a sintered silica powder and silica aerogel.

5. A method according to claim 1, wherein the solvent for dissolving and removing the hardened adhesive is at least one compound selected from the group consisting of an aromatic hydrocarbon, a halogenated hydrocarbon, methyl ethyl ketone, and cyclohexane.

* * * * *